(12) United States Patent
Reuland et al.

(10) Patent No.: US 7,551,002 B1
(45) Date of Patent: Jun. 23, 2009

(54) METHOD AND APPARATUS FOR IMPLEMENTING BALANCED CLOCK DISTRIBUTION NETWORKS ON ASICS WITH VOLTAGE ISLANDS FUNCTIONING AT MULTIPLE OPERATING POINTS OF VOLTAGE AND TEMPERATURE

(75) Inventors: Paul Gary Reuland, Rochester, MN (US); Brian Andrew Schuelke, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/014,172

(22) Filed: Jan. 15, 2008

(51) Int. Cl.
*H03K 19/00* (2006.01)
(52) U.S. Cl. .............................. 326/93; 326/38; 326/40
(58) Field of Classification Search ............. 326/37–41, 326/63–68, 82, 83, 93–98
See application file for complete search history.

(56) References Cited

U.S. PATENT DOCUMENTS

| | | | | |
|---|---|---|---|---|
| 6,081,145 A * | 6/2000 | Bandai et al. | ............... | 327/231 |
| 6,429,715 B1 * | 8/2002 | Bapat et al. | .................. | 327/295 |
| 6,856,171 B1 * | 2/2005 | Zhang | .......................... | 326/93 |
| 6,879,202 B2 * | 4/2005 | Nguyen | ....................... | 327/295 |
| 2003/0197529 A1 * | 10/2003 | Campbell | ..................... | 326/93 |
| 2008/0303552 A1 * | 12/2008 | Chueh et al. | .................. | 326/93 |

\* cited by examiner

*Primary Examiner*—Don P Le
(74) *Attorney, Agent, or Firm*—Joan Pennington (57) ABSTRACT

A method and apparatus implement balanced clock distribution networks on application specific integrated circuits (ASICs) with voltage islands functioning at multiple operating points of voltage and temperature, and a design structure on which the subject circuit resides is provided. A clock source is coupled to an N-level balanced clock tree providing a clock signal. Each of a plurality of voltage islands includes a respective voltage shifter and programmable delay function receiving the clock signal. Each respective voltage shifter and programmable delay function provides a second clock signal to a respective balanced clock tree for the associated voltage island. A system controller provides a respective control input to each respective voltage shifter and programmable delay function. The respective control input is varied dynamically corresponding to an operational mode of the respective voltage island.

20 Claims, 5 Drawing Sheets

FIG. 1

PRIOR ART

METHOD AND APPARATUS FOR IMPLEMENTING BALANCED CLOCK DISTRIBUTION NETWORKS ON ASICS WITH VOLTAGE ISLANDS FUNCTIONING AT MULTIPLE OPERATING POINTS OF VOLTAGE AND TEMPERATURE

FIELD OF THE INVENTION

The present invention relates generally to the data processing field, and more particularly, relates to a method and apparatus for implementing balanced clock distribution networks on application specific integrated circuits (ASICs) with voltage islands functioning at multiple operating points of voltage and temperature, and a design structure on which the subject circuit resides.

DESCRIPTION OF THE RELATED ART

In an effort to reduce power consumption for ASIC designs, methodologies have been proposed to power different portions of the chip at different supply voltages (Vdd). Within some known technology or design methodology this is accomplished through the usage of voltage islands.

This usage of voltage islands allows for voltage to be scaled for achieving performance targets for different partitions of logic. A lower voltage is applied to areas of logic that do not have aggressive performance targets. This reduces both the dynamic and static power consumption of this logic resulting in significant overall power savings for the chip.

Using voltage islands generally complicates the overall design methodology required to develop the chip. One area in particular is the insertion of a balanced clock tree. Clock trees are synthesized with the goal of having all clocks within a clock domain arrive at their sinks at the same time. Voltage islands complicate this requirement by having different voltages across the chip that could be operating at different best and worst case conditions. Methodologies exist to insert and balance a clock tree across a set of voltage islands.

Figure 1:
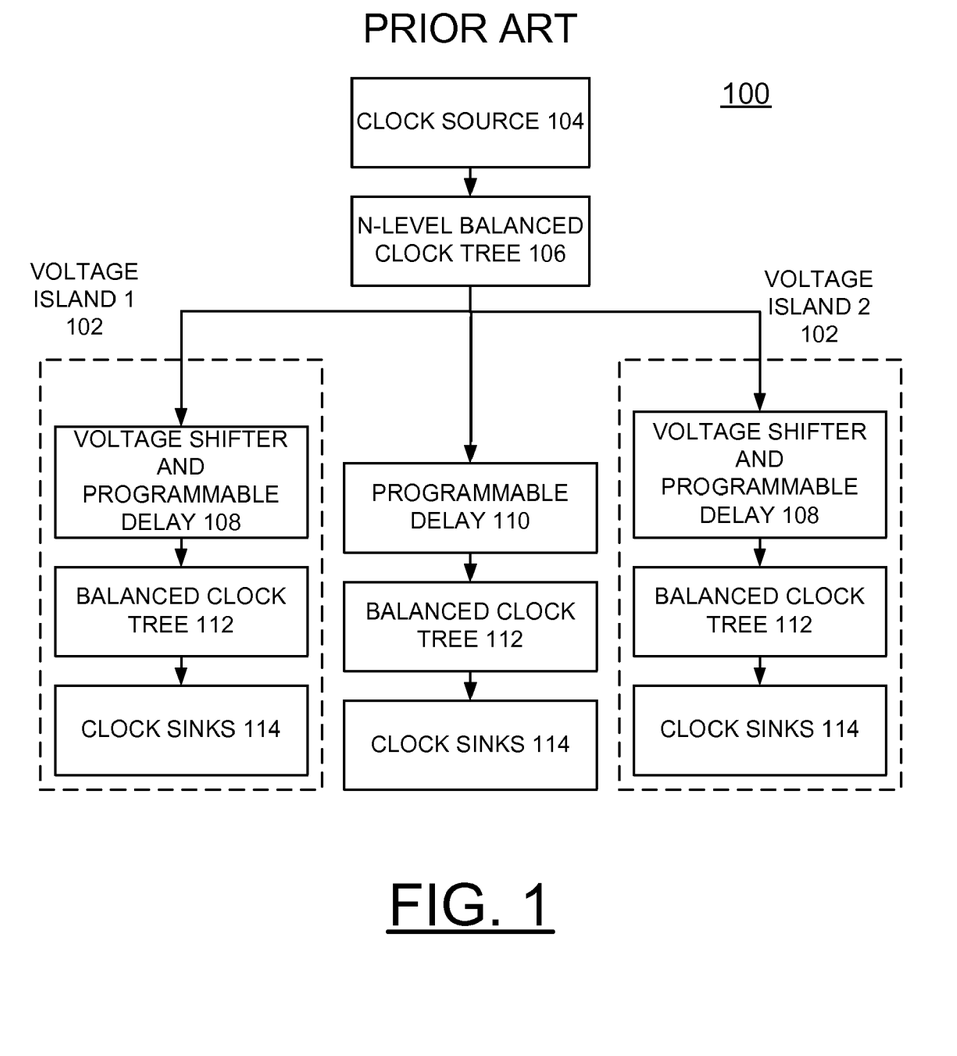
FIG. 1 is block diagram representation of a prior art clock structure for ASICs with multiple voltage islands.
Figure 2:
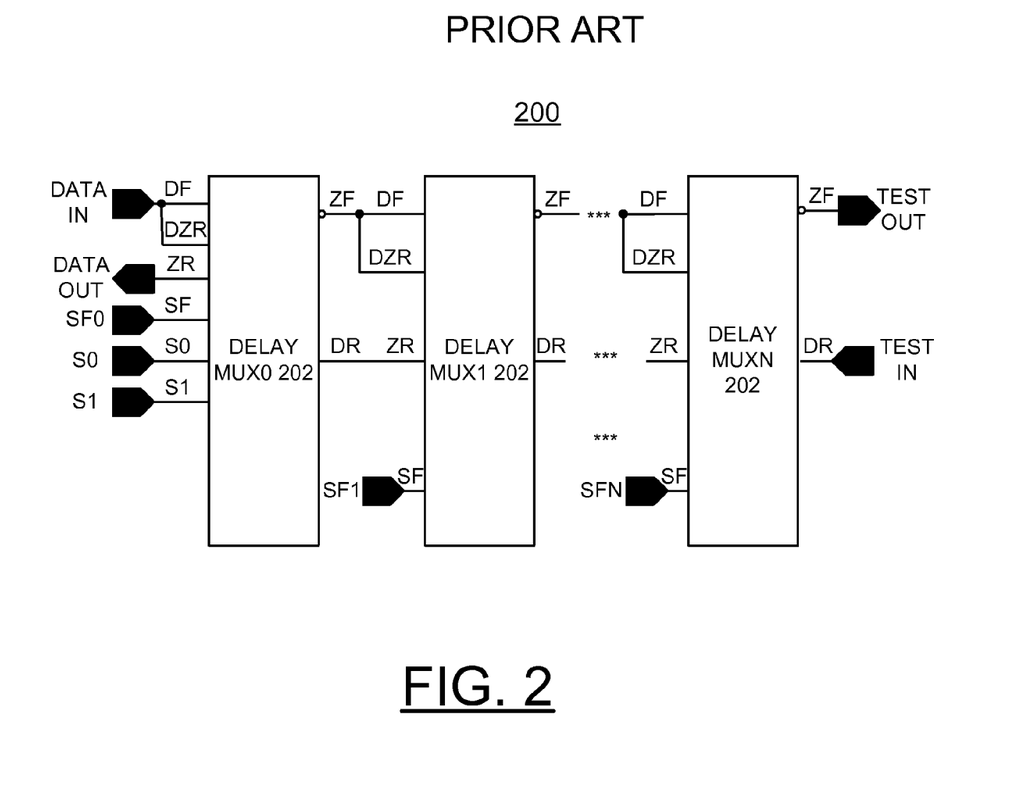
FIG. 2 is block diagram representation of prior art programmable delay elements for clock structures for ASICs with multiple voltage islands.

FIGS. 1 and 2 illustrate prior art arrangement for balancing clock trees across a static set of voltage islands, where the voltage of the islands is set at the time of design completion.

FIG. 1 illustrates a conventional clock structure 100 for ASICs with multiple voltage islands 102 with a clock source 104 coupled to an N-level balanced clock tree 106. In the prior art clock structure 100, the N-level balanced clock tree 106 provides a clock signal to a voltage shifter and programmable delay 108 of each voltage island 102 and provides a clock signal to a chip core programmable delay 110. A respective balanced clock tree 112 is connected to the voltage shifter and programmable delay 108 within each voltage island 102 and is connected to the chip core programmable delay 110. Respective clock sinks 114 are connected to each of the respective balanced clock tree 112.

In conjunction with voltage island usage, designers are turning to dynamic voltage scaling (DVS) to further optimize power and performance. With dynamic voltage scaling, the voltage of the respective islands is scaled to meet the current application requirements. This dynamic voltage scaling can take numerous forms, such as, including 1) an ASIC that is used in different environments that have significantly different power/performance requirements, or 2) an ASIC that adjusts the operating voltage based upon the present, real time performance requirements.

FIG. 2 illustrates prior art programmable delay elements 200 for a clock structure for ASICs with multiple series connected delay multiplexers 202, MUX0-N with a data input DATA IN applied to a first delay multiplexer 202, delay MUX0 at inputs DF, DZR, and providing a data output DATA OUT at output ZR of the first delay multiplexer 202, delay MUX0. The first delay multiplexer 202, delay MUX0 receives inputs SF0, S0, and S1 indicated at inputs SF, S0, and S1 of the delay MUX0. The respective multiplexers 202, MUX1-N receives a respective input SF1, SFN, indicated at input SF.

One prior art programmable delay clock structure provides globally asynchronous but locally synchronous clocking. With this clock structure arrangement, clock domains that cross voltage islands are treated as synchronous within the island but as separate asynchronous domains between islands. This arrangement has applicability for some designs but has some significant drawbacks that make it insufficient for a large population of designs. Significant drawbacks include the timing penalty to re-synchronize signals that cross the voltage island boundary. This penalty can be significant and in many cases may violate the protocol of the interface between the logic of the two islands. In many cases the logic that is crossing the voltage islands may be part of a design that is not owned by a particular designer. In this case, it is not possible to break the logic into partitions that operate asynchronously. In many cases, the logic that is crossing the voltage islands may be part of reusable logic that the customer does not plan to modify for its usage in the ASIC.

The clock structure 100 generally enables clock balancing across a single static set of conditions that are pre-determined at the time of physical design. The clock structure 100 can utilize programmable delay elements 202 as shown in FIG. 2 to accelerate the physical design process of making changes to the clock tree to balance the network. In low power ASIC applications, it is often required to have the chip run in different modes to accommodate different power/performance requirements. In this case, the voltage islands can operate at many different combinations of voltage, frequency and duty cycle, which is the amount of time the island is powered on. The prior art clock structure 100 has the significant disadvantage of requiring a one time balance of the clock network that must accommodate, as best possible, a super-set of all valid combinations.

Clock voltage skew is defined as the maximum amount that the arrival time of a clock varies due to voltage domain floating from best case to worst case and back. Design modifications cannot compensate for the voltage skew other than to reduce the overall latency of the clock tree, and consequently reduce the worst case to best case latency variation. The voltage skew has a very direct affect on the ability to close timing at the desired performance across all modes of operation. The voltage skew is determined by the voltage swing from best case to worst case for the voltage island.

As the voltage of different partitions of customer logic is varied, it is not possible with the current methodology to maintain a balanced clock tree. As the skew of the clocks arriving at a clock sink increases, the attainable clock frequency is significantly reduced. In many cases with the clock skew that exists across multiple operating voltages and across process and temperature corners, it is not possible to close static timing analysis.

A need exists for a method and apparatus for implementing balanced clock distribution networks on application specific integrated circuits (ASICs) with voltage islands functioning at multiple operating points of voltage and temperature.

SUMMARY OF THE INVENTION

Principal aspect of the present invention are to provide a method and apparatus for implementing balanced clock distribution networks on application specific integrated circuits (ASICs) with voltage islands functioning at multiple operating points of voltage and temperature. Other important aspects of the present invention are to provide such method and apparatus for implementing balanced clock distribution networks substantially without negative effect and that overcome many of the disadvantages of prior art arrangements.

In brief, a method and apparatus for implementing balanced clock distribution networks on application specific integrated circuits (ASICs) with voltage islands functioning at multiple operating points of voltage and temperature, and a design structure on which the subject circuit resides are provided. A clock source is coupled to an N-level balanced clock tree providing a clock signal. Each of a plurality of voltage islands includes a respective voltage shifter and programmable delay function receiving the clock signal. Each respective voltage shifter and programmable delay function provides a second clock signal to a respective balanced clock tree for the associated voltage island. A system controller provides a respective control input to each respective voltage shifter and programmable delay function. The respective control input is varied dynamically corresponding to an operational mode of the respective voltage island.

In accordance with features of the invention, the respective voltage islands include multiple operational modes including dynamically varying voltages for the voltage islands. The respective dynamically varied control input provides programmed delay settings corresponding to multiple operational modes of the voltage islands enabling enhanced clock tree balancing. By maintaining the enhanced balanced clock tree, the clock structure of the invention is able to attain a higher operating frequency due to the reduced penalty for clock skew.

In accordance with features of the invention, the system controller includes a plurality of multiplexers for each of the voltage islands and a chip core. Predefined values to set the multiplexer data inputs are determined with the clock network being balanced for each individual operational mode. Multiplexer select inputs are provided by an external chip input/output (I/O). Optionally an internal chip register is programmed to provide appropriate multiplexer select settings for the multiple operational modes for each of the voltage islands.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and apparatus enables clock tree balancing in an environment where the voltage island voltages are varying dynamically. In prior art clock structures such as illustrated in FIGS. 1 and 2, programmable delay elements are included in the methodology to enable quicker metallization changes to reduce physical design time to insert a balanced clock tree.

In accordance with features of the invention, controls used to program the delay elements are exposed to the customer logic to enable dynamic balancing of the customer clock tree to match dynamically varying voltage island voltages, such as customer intended voltage changes within voltage islands. By maintaining a more balanced clock tree, the clock structure of the invention is able to attain a higher operating frequency due to the reduced penalty for clock skew.

Figure 3:
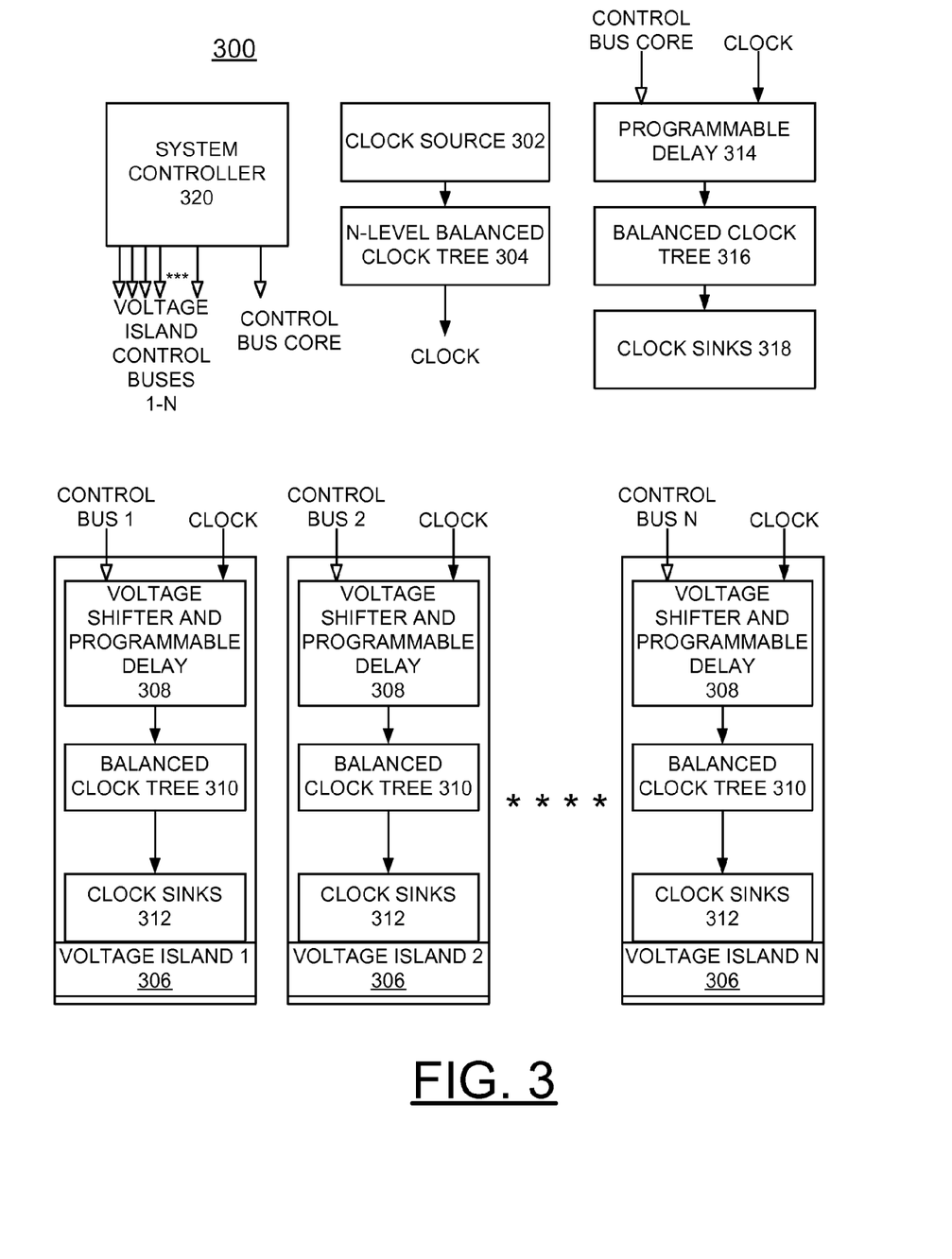
FIG. 3 is a schematic and block diagram representation of an exemplary clock structure in accordance with the preferred embodiment.

Having reference now to the drawings, in FIG. 3, there is shown an exemplary clock structure generally designated by the reference character 300 in accordance with the preferred embodiment.

Clock structure 300 allows a clock network to be balanced for different combinations of operating modes. Clock structure 300 provides a method and apparatus for utilizing programmable delay elements to re-balance the clock network based on the requirements of the current operational mode. By enabling the clock network to be re-balanced for different operating modes, the timing penalty for clock skew advantageously is reduced allowing the design to achieve higher performance targets.

Clock structure 300 includes a clock source 302 coupled to an N-level balanced clock tree 304 providing a clock signal indicated at line CLOCK. Each of a plurality of voltage islands 306, 1-N includes a voltage shifter and programmable delay 308 receiving the clock signal CLOCK and a respective control input CONTROL BUS 1-N.

Each of the plurality of voltage islands 306, 1-N includes a balanced clock tree 310 coupled to the voltage shifter and programmable delay 308. Respective clock sinks 312 are connected to each of the respective balanced clock tree 310.

A core ASIC includes a programmable delay 314 receiving the clock signal CLOCK and a control input CONTROL BUS CORE. A balanced clock tree 316 is coupled to the programmable delay 314. Clock sinks 318 are connected to each of the respective balanced clock tree 110 within the voltage island 306.

Clock structure 300 includes a system controller 320 in accordance with the preferred embodiment providing the control signals CONTROL BUS 1-N for the plurality of voltage islands 306, 1-N and CONTROL BUS CORE.

In accordance with features of the invention, instead of hard wiring the programmable delay controls to the power and ground rails, the control signals are routed to the system controller 320. For example, inside the system controller 320, programmable delay settings appropriate for different operational modes are fed to a series of multiplexers, one for the core voltage and one for each voltage island 306 of the chip. Based on the operational mode of the chip, the multiplexer select lines are used to route the appropriate settings to the programmable delay books 306, 314 to optimize the skew of the overall clock network.

In accordance with features of the invention, multiplexer select lines are controlled in a selected one of numerous ways, for example, including: 1) Wired to external chip I/O, which advantageously is used for cases where the functional mode is set at the board level. 2) Wired to an internal chip register that is programmed to the correct value based on the operational mode.

In accordance with features of the invention, the delay settings that need to be used per island and per operational mode that are fed to the data ports of the multiplexers within the system controller 320 could be programmed in numerous ways including: 1) Hard Wired during physical design; 2) Connected to registers that are programmed to the correct value based on results from physical design. Note the registers must reset to initial values that result in a clock network balanced sufficiently to enable register programming. To determine the proper values to set the multiplexer data inputs, the clock network is balanced for each individual operational mode. One example of an exemplary simple system controller 400 to implement system controller 320 is shown in FIG. 4

Figure 4:
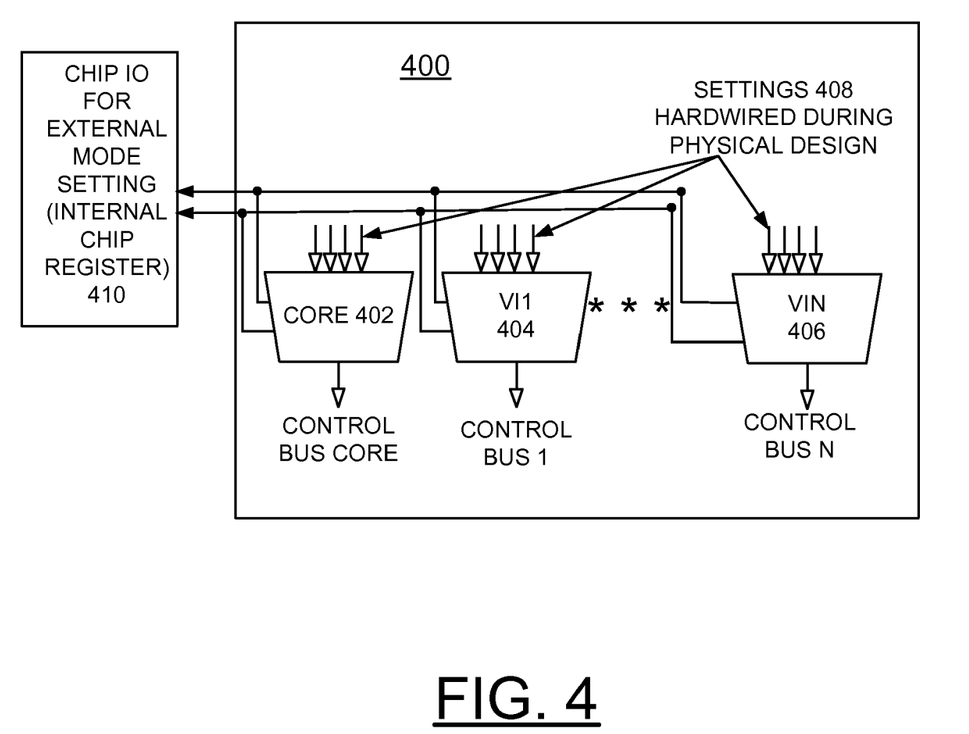
FIG. 4 is a schematic and block diagram representation of an exemplary system controller for the clock structure of FIG. 3 in accordance with the preferred embodiment.

Referring to FIG. 4, there is shown an exemplary system controller generally designated by the reference character 400 in accordance with the preferred embodiment. System controller 400 is provided, for example, for use with the clock structure 300 implementing the system controller 320.

System controller 400 includes a first core multiplexer 402 for providing the control signals CONTROL BUS CORE, for example, applied to the programmable delay 314 of the clock structure 300. System controller 400 includes a plurality of voltage island multiplexers 404, 406 VI1-V1N (voltage island 1-voltage island N), for example, for providing the control signals CONTROL BUS 1-N to each voltage shifter and programmable delay 308 of the plurality of voltage islands 306, 1-N of the clock structure 300. A plurality of setting 408 for each of the multiplexers 402, 404, 406 is hardwired during the physical design. An external chip input/output (I/O) 410 controls multiplexer select lines. Optionally an internal chip register 410 is programmed and provides appropriate multiplexer select settings for multiple functional modes.

Consider the following example that a chip has two voltage islands that are required to run in two different modes as follows:

Mode 1

Frequency 100 MHz

Voltages

Core—0.90V+/−5%

Voltage Island 1—1.0V+/−5%

Voltage Island 2—0.90V+/−5%

Mode 2

Frequency 200 MHz

Voltages

Core—0.90V+/−5%

Voltage Island 1—Off

Voltage Island 2—1.20V+/−5%

Using the conventional method the voltage skew component of the overall clock skew is based on a clock skew created by a voltage swing of 0.090V for island 1 and 0.405V for island 2 for an overall swing of 0.495V.

In accordance with features of the invention, the maximum voltage skew would be based on voltage swings of 0.090V for island 1 and 0.12V for island 2 for an overall swing of 0.21V. Depending on the structure of the clock tree, this difference has a significant impact on the timing closure process and the overall attainable performance of the chip.

Figure 5:
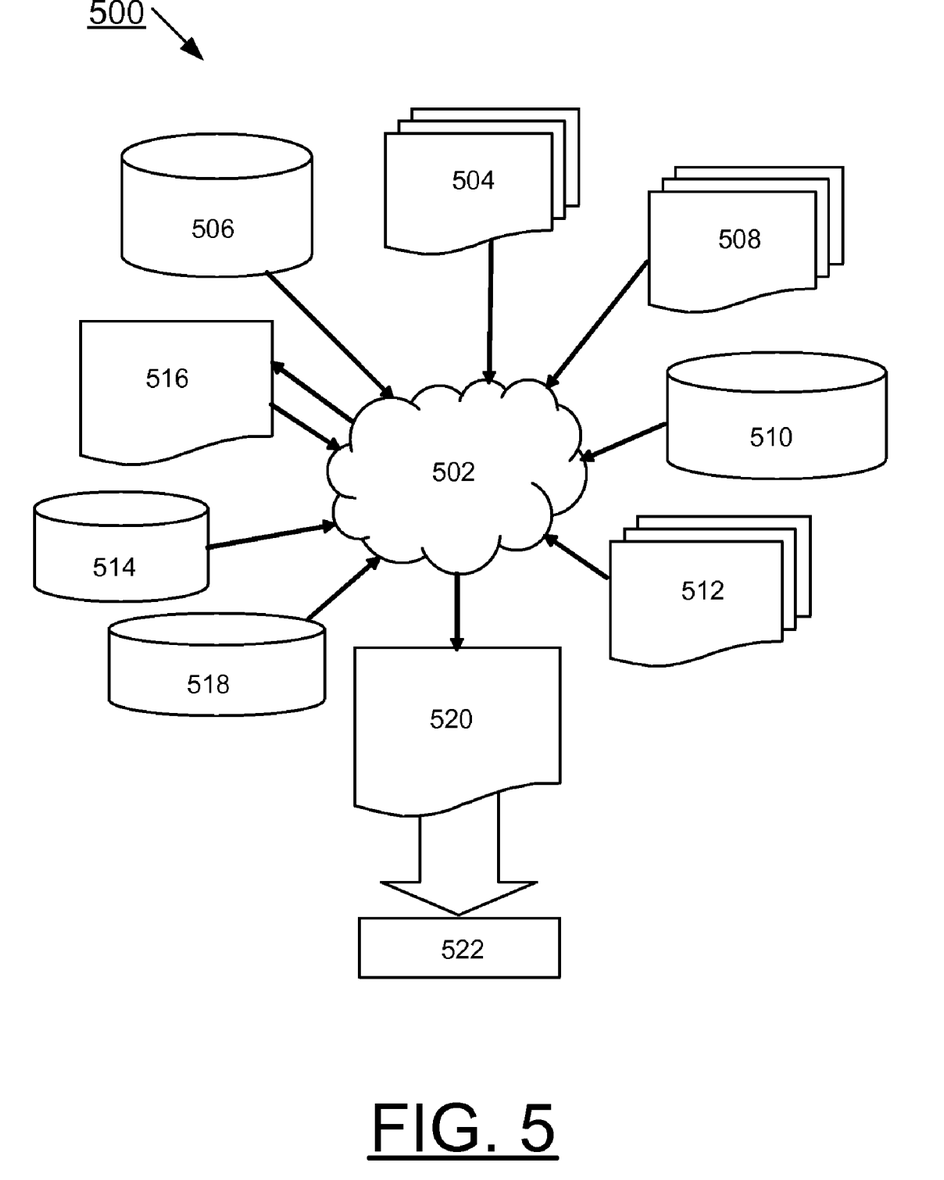
FIG. 5 is a flow diagram of a design process used in semiconductor design, manufacturing, and/or test.

FIG. 5 shows a block diagram of an example design flow 500. Design flow 500 may vary depending on the type of IC being designed. For example, a design flow 500 for building an application specific IC (ASIC) may differ from a design flow 500 for designing a standard component. Design structure 502 is preferably an input to a design process 504 and may come from an IP provider, a core developer, or other design company or may be generated by the operator of the design flow, or from other sources. Design structure 502 comprises circuit 300, and circuit 400 in the form of schematics or HDL, a hardware-description language, for example, Verilog, VHDL, C, and the like. Design structure 502 may be contained on one or more machine readable medium. For example, design structure 502 may be a text file or a graphical representation of circuit 300. Design process 504 preferably synthesizes, or translates, circuit 300, and circuit 400 into a netlist 506, where netlist 506 is, for example, a list of wires, transistors, logic gates, control circuits, I/O, models, etc. that describes the connections to other elements and circuits in an integrated circuit design and recorded on at least one of machine readable medium. This may be an iterative process in which netlist 506 is resynthesized one or more times depending on design specifications and parameters for the circuit.

Design process 504 may include using a variety of inputs; for example, inputs from library elements 508 which may house a set of commonly used elements, circuits, and devices, including models, layouts, and symbolic representations, for a given manufacturing technology, such as different technology nodes, 32 nm, 45 nm, 90 nm, and the like, design specifications 510, characterization data 512, verification data 514, design rules 516, and test data files 518, which may include test patterns and other testing information. Design process 504 may further include, for example, standard circuit design processes such as timing analysis, verification, design rule checking, place and route operations, and the like. One of ordinary skill in the art of integrated circuit design can appreciate the extent of possible electronic design automation tools and applications used in design process 504 without deviating from the scope and spirit of the invention. The design structure of the invention is not limited to any specific design flow.

Design process 504 preferably translates an embodiment of the invention as shown in FIGS. 3, and 4 along with any additional integrated circuit design or data (if applicable), into a second design structure 520. Design structure 520 resides on a storage medium in a data format used for the exchange of layout data of integrated circuits, for example, information stored in a GDSII (GDS2), GL1, OASIS, or any other suitable format for storing such design structures. Design structure 520 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3, and 4. Design structure 520 may then proceed to a stage 522 where, for example, design structure 520 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. An apparatus for implementing balanced clock distribution networks on application specific integrated circuits (ASICs) with voltage islands functioning at multiple operating points of voltage and temperature comprising:
   a clock source;
   an N-level balanced clock tree coupled to said clock source and providing a first clock signal;
   each of a plurality of voltage islands including a respective voltage shifter and programmable delay function receiving said first clock signal; each respective voltage shifter and programmable delay function providing a second clock signal;
   a respective balanced clock tree coupled to each respective voltage shifter and programmable delay function receiving said second clock signal;
   a system controller providing a respective control input to each respective voltage shifter and programmable delay function; said respective control input being varied dynamically corresponding to an operational mode of the respective voltage island.

2. The apparatus for implementing balanced clock distribution networks as recited in claim 1 wherein each of said respective voltage islands include multiple operational modes including dynamically varying voltages for each of said respective voltage island.

3. The apparatus for implementing balanced clock distribution networks as recited in claim 1 wherein said respective dynamically varied control input provides programmed delay settings corresponding to multiple operational modes of the voltage islands for enabling enhanced balancing of said respective balanced clock tree.

4. The apparatus for implementing balanced clock distribution networks as recited in claim 1 wherein said enhanced balancing of said respective balanced clock tree enables an increase operating frequency of said second clock signal.

5. The apparatus for implementing balanced clock distribution networks as recited in claim 1 wherein said system controller includes a plurality of multiplexers for each of said voltage islands and a chip core.

6. The apparatus for implementing balanced clock distribution networks as recited in claim 5 wherein predefined values are applied to a plurality of multiplexer data inputs for said plurality of multiplexers.

7. The apparatus for implementing balanced clock distribution networks as recited in claim 6 wherein said predefined values applied to said plurality of multiplexer data inputs are determined with each said respective balanced clock tree being balanced for each of said multiple operational modes.

8. The apparatus for implementing balanced clock distribution networks as recited in claim 5 include predefined multiplexer select inputs applied to a plurality of multiplexer select inputs for said plurality of multiplexers.

9. The apparatus for implementing balanced clock distribution networks as recited in claim 8 wherein said predefined multiplexer select inputs are provided by an external chip input/output (I/O).

10. The apparatus for implementing balanced clock distribution networks as recited in claim 8 wherein said predefined multiplexer select inputs are provided by an internal chip register.

11. The apparatus for implementing balanced clock distribution networks as recited in claim 8 wherein said internal chip register is programmed to provide said multiplexer select settings for said multiple operational modes.

12. A method for implementing balanced clock distribution networks on application specific integrated circuits (ASICs) with voltage islands functioning at multiple operating points of voltage and temperature comprising the steps of:
   providing a clock source;
   coupling an N-level balanced clock tree to said clock source and providing a first clock signal;
   providing a respective voltage shifter and programmable delay function receiving said first clock signal with each of a plurality of voltage islands and providing a second clock signal each respective voltage shifter and programmable delay function;
   coupling a respective balanced clock tree to each respective voltage shifter and programmable delay function receiving said second clock signal;
   providing a respective control input to each respective voltage shifter and programmable delay function; said respective control input being varied dynamically corresponding to an operational mode of the respective voltage island.

13. The method for implementing balanced clock distribution networks as recited in claim 12 wherein each of said respective voltage islands include multiple operational modes including dynamically varying voltages for each of said respective voltage island and wherein providing said respective control input to each respective voltage shifter and programmable delay function includes dynamically varying said respective control input for providing programmed delay settings corresponding to the multiple operational modes of the voltage islands.

14. The method for implementing balanced clock distribution networks as recited in claim 13 wherein dynamically varying said respective control input for providing programmed delay settings corresponding to the multiple operational modes of the voltage islands enables enhanced balancing of said respective balanced clock tree.

15. The method for implementing balanced clock distribution networks as recited in claim 13 wherein providing said respective control input to each respective voltage shifter and programmable delay function includes providing a system controller includes a plurality of multiplexers; one said multiplexer for each of said voltage islands and a chip core.

16. The method for implementing balanced clock distribution networks as recited in claim 15 includes applying predefined values to a plurality of multiplexer data inputs for said plurality of multiplexers; said predefined values being determined with each said respective balanced clock tree being balanced for each of said multiple operational modes.

17. The method for implementing balanced clock distribution networks as recited in claim 15 includes applying predefined multiplexer select inputs to a plurality of multiplexer select inputs for said plurality of multiplexers.

18. A design structure embodied in a machine readable medium used in a design process, the design structure comprising:
   a clock source;
   an N-level balanced clock tree coupled to said clock source and providing a first clock signal;
   each of a plurality of voltage islands including a respective voltage shifter and programmable delay function receiving said first clock signal; each respective voltage shifter and programmable delay function providing a second clock signal;
   a respective balanced clock tree coupled to each respective voltage shifter and programmable delay function receiving said second clock signal;
   a system controller providing a respective control input to each respective voltage shifter and programmable delay function; said respective control input being varied dynamically corresponding to an operational mode of the respective voltage island.

19. The design structure of claim 18, wherein the design structure comprises a netlist, which describes the circuit, and wherein the design structure resides on storage medium as a data format used for the exchange of layout data of integrated circuits.

20. The design structure of claim 18, wherein the design structure includes at least one of test data files, characterization data, verification data, or design specifications.

* * * * *